(12) United States Patent
Gangi et al.

(10) Patent No.: US 11,111,598 B2
(45) Date of Patent: Sep. 7, 2021

(54) CRYSTAL GROWTH METHOD IN A SEMICONDUCTOR DEVICE

(71) Applicants: KABUSHIKI KAISHA TOSHIBA, Minato-ku (JP); The Johns Hopkins University, Baltimore, MD (US)

(72) Inventors: Hiro Gangi, Tokyo (JP); Jongil Hwang, Kanagawa (JP); Thomas Kempa, Baltimore, MD (US); Eric Thompson, Baltimore, MD (US)

(73) Assignees: KABUSHIKI KAISHA TOSHIBA, Minato-ku (JP); The Johns Hopkins University, Baltimore, MD (US)

( * ) Notice: Subject to any disclaimer, the term of this patent is extended or adjusted under 35 U.S.C. 154(b) by 41 days.

(21) Appl. No.: 16/456,265

(22) Filed: Jun. 28, 2019

(65) Prior Publication Data
US 2020/0407871 A1 Dec. 31, 2020

(51) Int. Cl.
| | |
|---|---|
| *C30B 23/02* | (2006.01) |
| *H01L 21/02* | (2006.01) |
| *H01L 21/311* | (2006.01) |
| *H01L 21/768* | (2006.01) |
| *H01L 23/48* | (2006.01) |

(Continued)

(52) U.S. Cl.
CPC .......... *C30B 23/02* (2013.01); *H01L 21/0217* (2013.01); *H01L 21/0262* (2013.01); *H01L 21/02164* (2013.01); *H01L 21/02271* (2013.01); *H01L 21/02532* (2013.01); *H01L 21/02538* (2013.01); *H01L 21/02609* (2013.01); *H01L 21/02623* (2013.01); *H01L 21/02631* (2013.01); *H01L 21/02645* (2013.01); *H01L 21/31116* (2013.01); *H01L 21/76898* (2013.01); *H01L 23/481* (2013.01); *H01L 29/1095* (2013.01); *H01L 24/05* (2013.01); *H01L 24/16* (2013.01);

(Continued)

(58) Field of Classification Search
CPC ......... H01L 21/76898; H01L 21/02645; H01L 21/02609; H01L 21/02532; H01L 21/02623; H01L 21/02653; C30B 23/02
See application file for complete search history.

(56) References Cited

U.S. PATENT DOCUMENTS 6,605,535 B1 * 8/2003 Lee .......................... C30B 11/12
438/684
2007/0228496 A1 10/2007 Rochefort et al.
(Continued)

FOREIGN PATENT DOCUMENTS

| JP | 2003-197524 A | 7/2003 |
|---|---|---|
| JP | 2008-511982 A | 4/2008 |

(Continued)

*Primary Examiner* — Quoc D Hoang
(74) *Attorney, Agent, or Firm* — Oblon, McClelland, Maier & Neustadt, L.L.P.

(57) ABSTRACT

According to one embodiment, a crystal growth method includes forming a first member at at least a part of a bottom portion of a hole in a structure body. The hole includes the bottom portion and a side portion. The first member includes a first element. The first element is not adhered to at least a part of the side portion in the forming the first member. The crystal growth method includes growing a crystal member inside the hole by supplying a source material to the hole after the forming the first member. The source material includes a second element. The crystal member includes the second element.

19 Claims, 6 Drawing Sheets

(51) Int. Cl.
*H01L 29/10* (2006.01)
*H01L 29/78* (2006.01)
*H01L 23/00* (2006.01)

(52) U.S. Cl.
CPC .. *H01L 29/7827* (2013.01); *H01L 2224/0557* (2013.01); *H01L 2224/16148* (2013.01)

(56) References Cited

U.S. PATENT DOCUMENTS

2009/0057839 A1* 3/2009 Lewis ................. H01L 21/0262
257/618
2017/0040414 A1 2/2017 Saito

FOREIGN PATENT DOCUMENTS

| JP | 2009-224606 A | 10/2009 |
| JP | 2017-34154 A | 2/2017 |
| JP | 2021-9984 A | 1/2021 |

\* cited by examiner

CRYSTAL GROWTH METHOD IN A SEMICONDUCTOR DEVICE

FIELD

Embodiments described herein relate generally to a crystal growth method and a semiconductor device.

BACKGROUND

There is technology that grows a crystal inside a hole in a semiconductor device or the like. It is desirable for such a crystal to be a high-quality crystal.

DETAILED DESCRIPTION

According to one embodiment, a crystal growth method includes forming a first member at at least a part of a bottom portion of a hole in a structure body. The hole includes the bottom portion and a side portion. The first member includes a first element. The first element is not adhered to at least a part of the side portion in the forming the first member. The crystal growth method includes growing a crystal member inside the hole by supplying a source material to the hole after the forming the first member. The source material includes a second element. The crystal member includes the second element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1:
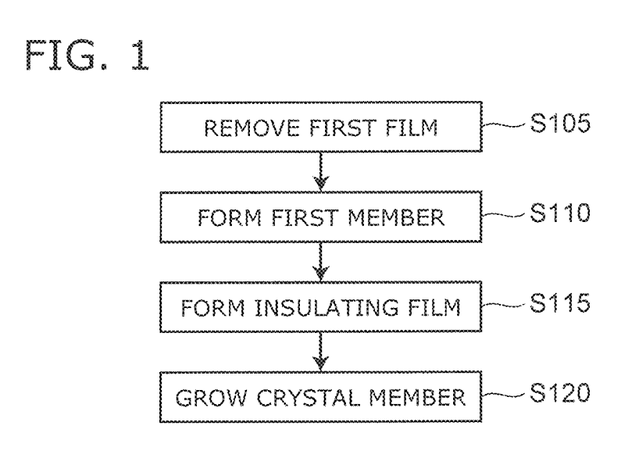
FIG. 1 is a flowchart illustrating a crystal growth method according to a first embodiment.

FIG. 1 is a flowchart illustrating a crystal growth method according to a first embodiment.

As shown in FIG. 1, the crystal growth method according to the embodiment includes a first member formation process of forming a first member (step S110) and a growth process of growing a crystal member (step S120). The crystal growth method may further include a removal process of removing a first film (step S105). As described below, the crystal growth method may further include an insulating film formation process of forming an insulating film (step S115).

Examples of these processes will now be described.

FIG. 2A to FIG. 2E are schematic views illustrating the crystal growth method according to the first embodiment.

Figure 2A:
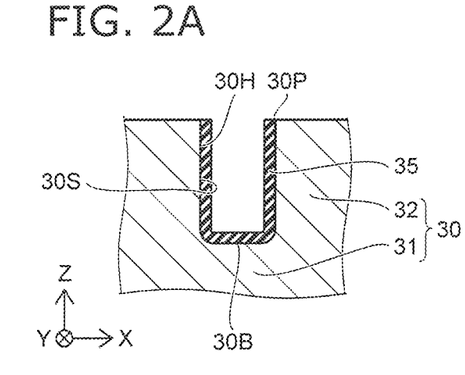
FIG. 2A to FIG. 2E are schematic views illustrating the crystal growth method according to the first embodiment.
Figure 2B:
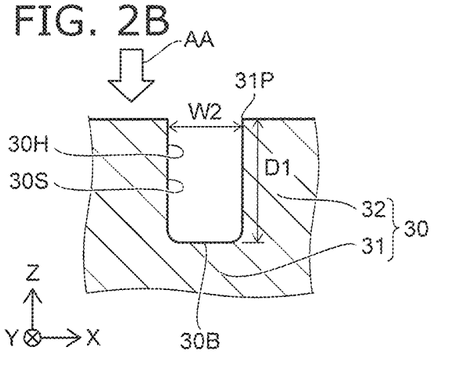
Figure 2C:
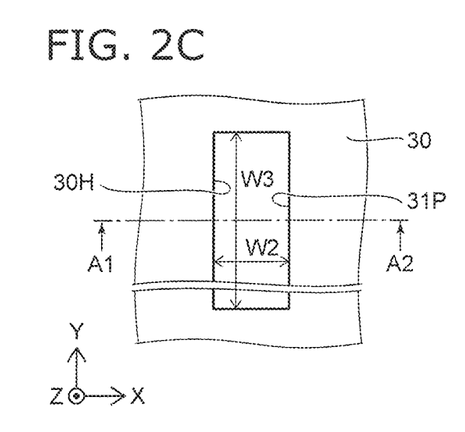

FIG. 2A, FIG. 2B, FIG. 2D, and FIG. 2E are cross-sectional views. FIG. 2C is a plan view as viewed along arrow AA of FIG. 2B. FIG. 2B is a line A1-A2 cross-sectional view of FIG. 2C.

A structure body 30 is prepared as shown in FIG. 2A. The structure body 30 has a hole 30H. The hole 30H includes a bottom portion 30B and a side portion 30S. The hole 30H has an opening 30P. The hole 30H may be a recess. The structure body 30 includes a crystal. The structure body 30 includes, for example, a semiconductor.

A first film 35 is provided in the example. The first film 35 is provided at the bottom portion 30B and the side portion 30S.

In one example, the structure body 30 includes silicon. In such a case, the first film 35 includes a compound including silicon. For example, the first film 35 includes silicon oxide.

As described above, the crystal growth method according to the embodiment may include a removal process of removing at least a portion of the first film 35 (step S105: referring to FIG. 1). For example, in the case where the first film 35 includes silicon oxide, processing is performed using, for example, buffered hydrogen fluoride. Processing that uses oxygen plasma may be performed before the buffered hydrogen fluoride processing. The first film 35 that includes silicon oxide is removed by such processing. The duration of the processing using buffered hydrogen fluoride is, for example, not less than 30 seconds and not more than 5 minutes. The duration of the processing may depends on the material and the thickness of the first film 35, for example. The power of the oxygen plasma processing is, for example, not less than 300 W and not more than 1000 W. The duration of the oxygen plasma processing is, for example, not less than 10 seconds and not more than 2 minutes.

For example, the first film 35 is formed by oxidizing the surface of the structure body 30. In the case where the first film 35 is not provided, the removal process recited above (step S105) can be omitted. Examples of the material of the structure body 30 and examples of the material of the first film 35 are described below.

The structure body 30 is obtained by the removal of the first film 35 (referring to FIG. 2B). The structure body 30 has the hole 30H. The hole 30H includes the bottom portion 30B, the side portion 30S, and the opening 30P. The direction from the bottom portion 30B toward the opening 30P is taken as a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

As shown in FIG. 2C, the hole 30H has a length W2 in the second direction and a length W3 in a third direction. The second direction crosses the first direction (the Z-axis direction). In the example, the second direction is the X-axis direction. The third direction crosses a plane including the first direction and the second direction. The third direction is, for example, the Y-axis direction.

In the example as shown in FIG. 2C, the length W2 is shorter than the length W3. For example, the hole 30H is a "trench." The length W2 may be substantially the same as the length W3. For example, the configuration of the hole 30H when cut by the X-Y plane may be substantially square or substantially circular. Hereinbelow, the length W2 is taken to be not more than the length W3. In the hole 30H, the direction of the shorter length corresponds to the second direction. The direction of the longer length corresponds to the third direction. The hole 30H is, for example, a trench or a via hole.

As shown in FIG. 2B, a depth D1 of the hole 30H is the length along the first direction (the Z-axis direction) of the hole 30H. For example, the depth D1 is greater than the length W2. In the embodiment, for example, the aspect ratio of the hole 30H is high. The aspect ratio is, for example, the ratio of the depth D1 to the length W2.

For example, the hole 30H is formed by removing a portion of the member used to form the structure body 30. For example, the removal is performed by dry etching or wet etching.

As shown in FIG. 2B, the structure body 30 includes a first region 31 and a second region 32. The first region 31 includes the bottom portion 30B. The second region 32 includes the side portion 30S. In the example, the second region 32 is continuous with the first region 31. For example, the first region 31 and the second region 32 are seamless. The structure body 30 includes a crystal; and the first region 31 and the second region 32 also include a crystal. The crystal orientation of the second region 32 is substantially the same as the crystal orientation of the first region 31.

Figure 2D:
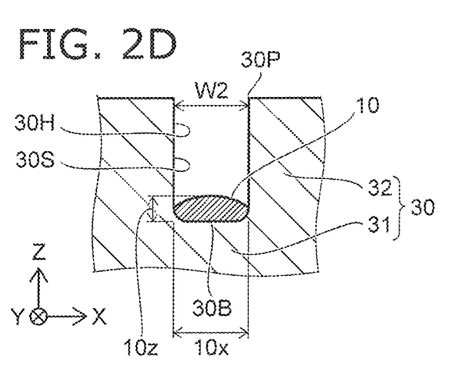

As shown in FIG. 2D, a first member 10 is formed at the bottom portion 30B of the hole 30H. The first member 10 includes a first element. The first element includes, for example, at least one selected from the group consisting of Au, Al, Ag, Bi, Cd, Co, Cu, Dy, Fe, Ga, Gd, In, Mg, Mn, Ni, Os, Pb, Pd, Pt, Te, Ti, and Zn. For example, the first member functions as a catalyst in the growth process of growing the crystal member (step S120). In the case where the crystal member is silicon, for example, the first element and the first member include Au.

Thus, in the first member formation process (step S110), the first member 10 that includes the first element is formed at the bottom portion 30B of the structure body 30 having the hole 30H. As shown in FIG. 2D, at least a portion of the side portion 30S is not covered with the first member 10. For example, the first element is not adhered to the side portion 30S in the formation of the first member 10. For example, the first element is not adhered to at least a portion of the side portion 30S in the formation of the first member 10. For example, the first member 10 is not adhered to the side portion 30S in the formation of the first member 10.

For example, the first member 10 is formed by vapor deposition of the first element. For example, the first member formation process (step S110) may include performing at least one of vapor deposition of the first element or "Long Throw Sputtering" of the first element. The spread angle in the direction in which the first element travels is small in these methods. For example, the first element enters the hole 30H from the opening 30P of the hole 30H along the Z-axis direction. The first element reaches the bottom portion 30B of the hole 30H. The adhesion of the first element to the side portion 30S is suppressed. Thereby, at least a portion of the side portion 30S is not covered with the first member 10. For example, the first member 10 is in a solid phase in the first member formation process (in FIG. 2D).

Figure 2E:
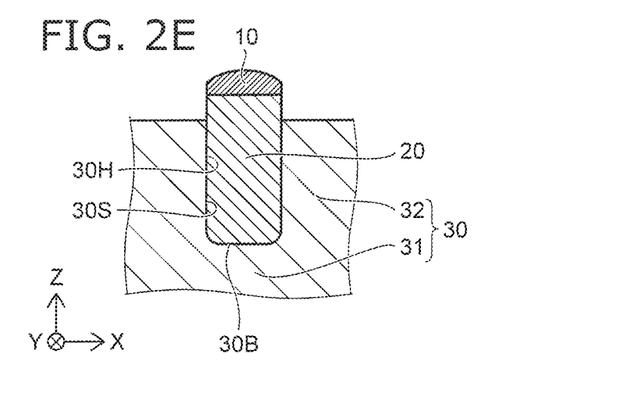

In the growth process (step S120) as shown in FIG. 2E, a crystal member 20 that includes a second element is grown inside the hole 30H by supplying a source material including the second element to the hole 30H after the first member formation process. For example, the supplying of the source material includes supplying a first gas. The growth process is performed at a high temperature. The temperature in the growth process is, for example, not less than 360° C. and not more than 1500° C. The temperature in the growth process is, for example, higher than an eutectic temperature of a material including a first element and the second element. The eutectic temperature of Au/Si is 363° C. In a case where the first member 10 includes Au and Si, the temperature is not less than 360° C. and not more than 1500° C., for example. The eutectic temperature of Al/Si is 577° C. In a case where the first member 10 includes Al and Si, the temperature is not less than 557° C. and not more than 800° C., for example. The eutectic temperature of Zn/Si is 419° C. In a case where the first member 10 includes Zn and Si, the temperature is not less than 419° C. and not more than 1500° C., for example. The eutectic temperature of Ti/Si is 1330° C. In a case where the first member 10 includes Ti and Si, the temperature is not less than 1330° C. and not more than 1500° C., for example. The interior of the chamber in the growth process is an atmospheric-pressure state or a reduced-pressure state. In the growth process, the pressure inside the chamber is, for example, not less than $1 \times 10^{-6}$ Pa and not more than $1.014 \times 10^6$ Pa. For example, the source material recited above (e.g., the first gas) includes a precursor. The precursor includes the second element.

The second element includes, for example, at least one selected from the group consisting of Si, Ge, Ga, and In. The crystal member 20 includes a crystal including the second element. The crystal member 20 includes, for example, at least one selected from the group consisting of Si, Ge, SiGe, GaAs, GaN, InP, GeTe, GeSbTe, $MoS_2$, and $MoSe_2$. In the case where the second element includes silicon, the crystal member 20 includes a silicon crystal.

As shown in FIG. 2D, the first member 10 contacts the bottom portion 30B of the hole 30H before the growth process (FIG. 2E). Because the growth process is performed at a high temperature, for example, the first member 10 is in a liquid phase in the growth process. In the growth process, the crystal member 20 is formed between the bottom portion 30B and the first member 10. For example, the crystal member 20 is epitaxially grown at the bottom portion 30B.

As the crystal member 20 grows, the first member 10 is pushed upward; and the position of the first member 10 ascends. The crystal member 20 contacts the bottom portion 30B in the growth process and after the growth process.

For example, the crystal orientation of the crystal member 20 that is grown is aligned with the crystal orientation of the bottom portion 30B. In the embodiment, the crystal member 20 that has a uniform crystal orientation is obtained.

In the embodiment, the first member 10 is provided at the bottom portion 30B and is substantially not provided at the side portion 30S. The crystal member 20 that grows using the first member 10 as a catalyst grows from the bottom portion 30B. The growth of the crystal member 20 from the side portion 30S is suppressed. Because the crystal member 20 grows in substantially one direction (the direction from the bottom portion 30B), the crystal orientation of the crystal member 20 becomes uniform easily. A crystal growth method that can grow a high-quality crystal can be provided.

For example, there is an example in which a seed layer is provided at the side portion of the hole. The seed layer is a Au layer. In the example, by performing high-temperature processing after forming the seed layer, a liquid of Au included in the seed layer flows and moves to the bottom portion of the hole. Subsequently, crystal growth is performed. In the example, the seed layer is once adhered to the side portion of the hole. Therefore, the seed layer remains easily on the side portion.

Therefore, in the example, growth from the bottom portion of the hole and growth from the side portion of the hole occur. The crystal member is formed by the crystal grown from the bottom portion of the hole and the crystal grown from the side portion of the hole contacting each other. In such an example, a distinct boundary or gap occurs easily between the crystal grown from the bottom portion of the hole and the crystal grown from the side portion of the hole. In the example, the crystal grows from multiple locations. The crystal orientations are not the same between the crystals grown from the multiple locations. Therefore, in the example, it is difficult to obtain a high-quality crystal member. For example, the size of the crystal grains included in the crystal member is small. In the example, multiple crystal grains that have mutually-different crystal orientations are formed easily.

Conversely, in the embodiment, the crystal member 20 is grown from the bottom portion 30B; and the growth of the crystal member 20 from the side portion 30S is suppressed effectively. The crystal member 20 that has a uniform crystal orientation is obtained easily thereby. For example, large crystal grains are obtained. For example, one crystal member 20 is substantially one crystal. According to the embodiment, for example, a crystal growth method that can grow a high-quality crystal can be provided.

In the embodiment, for example, multiple holes 30H may be provided in the structure body 30. In such a case, multiple crystal members 20 are provided to correspond to the multiple holes 30H. One of the multiple crystal members 20 is formed inside one of the multiple holes 30H. The crystal orientations of the multiple crystal members 20 are aligned respectively with the crystal orientations of the bottom portions 30B of the multiple holes 30H. Therefore, the crystal orientations of the multiple crystal members 20 are substantially the same. The crystal member 20 that has uniform characteristics is obtained. A higher-quality crystal is obtained easily.

In one example according to the embodiment as shown in FIG. 2E, the crystal member 20 contacts at least a portion of the side portion 30S of the hole 30H. The crystal member 20 that is grown from the bottom portion 30B grows while contacting the side portion 30S of the hole 30H. For example, the crystal member 20 grows while being affected by the side portion 30S. Thereby, the crystal orientation of the crystal member 20 reflects the crystal orientation of the side portion 30S.

In the embodiment, for example, the crystal orientation of the crystal member 20 is aligned with the crystal orientation of the first region 31 of the structure body 30. The crystal orientation of the crystal member 20 may be aligned with the crystal orientation of the second region 32 of the structure body 30. The crystal member 20 contacts at least a portion of the second region 32.

In the example recited above, a seed layer is provided at the side portion of the hole; and a liquid of the Au included in the seed layer moves to the bottom portion of the hole due to the high-temperature processing. In the example, because the seed layer is once adhered to the side portion of the hole, it is difficult to completely remove the seed layer that was adhered to the side portion.

In the embodiment, the first member 10 is formed at the bottom portion 30B so that the first element is not adhered to the side portion 30S in the formation of the first member 10. Because the first element is not adhered to the side portion 30S, the growth of the crystal member 20 from the side portion 30S is suppressed effectively.

An example of the formation state of the first member 10 will now be described.

Figure 3A:
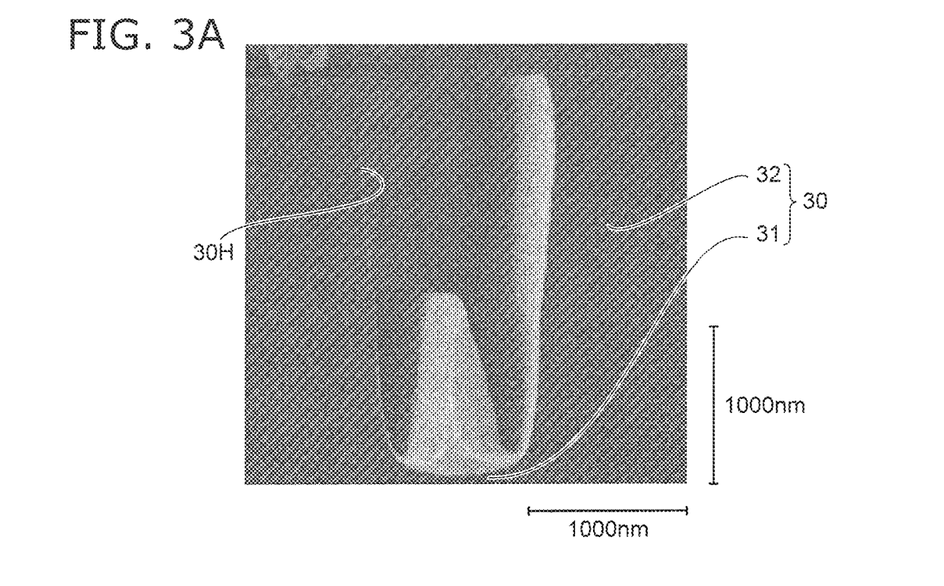
FIG. 3A and FIG. 3B are schematic views illustrating the crystal growth method according to the first embodiment.
Figure 3B:
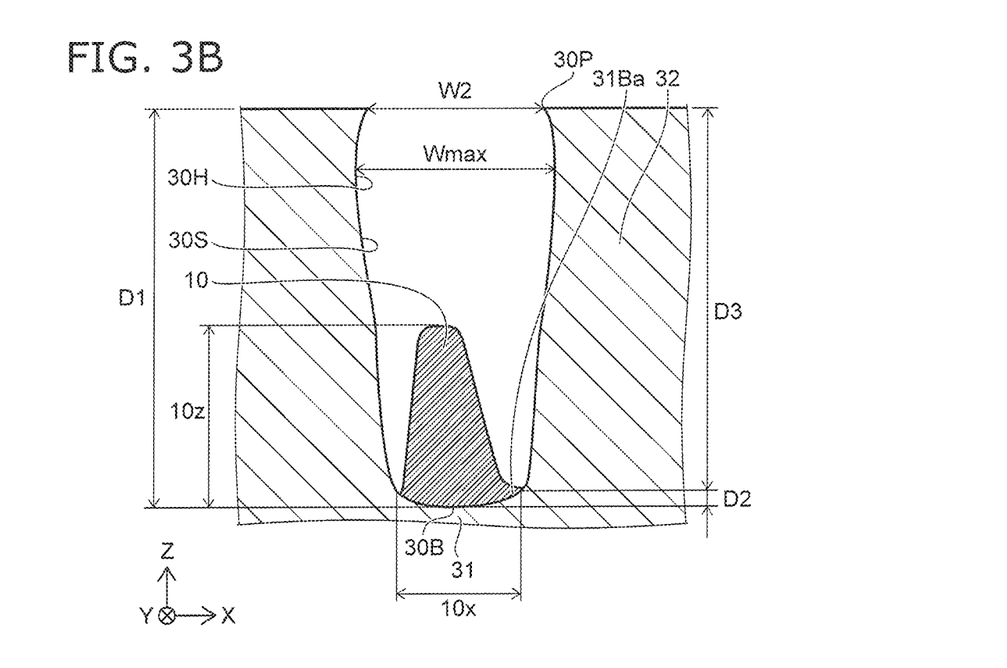

FIG. 3A and FIG. 3B are schematic views illustrating the crystal growth method according to the first embodiment.

FIG. 3A is a cross section SEM (Scanning Electron Microscope) image of the structure body 30. FIG. 3B is a schematic cross-sectional view drawn based on FIG. 3A. FIG. 3A and FIG. 3B illustrate the state after the first member formation process and before the growth process.

As shown in FIG. 3A and FIG. 3B, the structure body 30 that has the hole 30H is provided. As shown in FIG. 3B, the first member 10 is formed at the bottom portion 30B of the hole 30H. As shown in FIG. 3B, the cross-sectional configuration of the hole 30H is not always rectangular. For example, the bottom portion 30B of the hole 30H may include portions having curved configurations.

In one example, the bottom portion 30B may be defined as follows. For example, as described above, the direction from the bottom portion 30B toward the opening 30P is aligned with the first direction (i.e., the Z-axis direction). The length along the first direction of the hole 30H is taken as the depth D1. The depth D1 is, for example, the maximum value of the distance along the first direction between the bottom portion 30B and the opening 30P. As shown in FIG. 3B, the depth D1 is the sum of a bottom portion length D2 along the first direction of the bottom portion 30B and a side portion length D3 along the first direction of the side portion 30S. In the embodiment, the bottom portion length D2 may be defined at 50% of the depth D1. For example, in the embodiment, the position of 50% of the depth D1 of the hole 30H may be taken as the boundary between the bottom portion 30B and the side portion 30S. 50% of the depth D1 of the hole 30H corresponds to the length of the side portion 30S.

In the embodiment, the first member 10 is formed at the bottom portion 30B such as that recited above. The first element is not adhered to the side portion 30S such as that recited above. As shown in FIG. 3B, a portion 30Ba of the surface of the hole 30H is included in the bottom portion 30B. The first member 10 is formed at such a portion 30Ba of the surface of the hole 30H. The first element of the first member 10 is substantially not adhered to the region higher than the portion 30Ba of the surface.

As shown in FIG. 3B, the length of the first member 10 along the first direction from the bottom portion 30B toward the opening 30P is taken as a length 10z. The length of the first member 10 along the second direction crossing the first direction is taken as a length 10x. The second direction is the direction of the length W2 and is aligned with the X-axis direction. In the hole 30H, the direction of the shorter length corresponds to the second direction. For example, the length 10z of the first member 10 along the first direction (the Z-axis direction) is longer than the length 10x of the first member 10 along the second direction (in the example, the X-axis direction). The first member 10 that has a steep hill shape is formed.

In the embodiment, it is favorable for the length 10z of the first member 10 along the first direction (the Z-axis direction) to be not less than 20% of the length W2 of the opening 30P along the second direction (in the example, the X-axis direction). When the length 10z is not less than 20% of the length W2, substantially the entire bottom portion 30B of the hole 30H is covered with the first member 10 when the first member 10 changes to a liquid phase due to the high temperature. Thereby, the continuous crystal member 20 easily is grown uniformly.

When the length 10z is less than 20% of the length W2, the amount of the first member 10 is low. Therefore, the first member 10 is formed in an island state at the bottom portion 30B of the hole 30H when the first member 10 changes to a liquid phase due to the high temperature. In such a case, it may be difficult to obtain a continuous and uniform crystal member 20.

In the embodiment, a sufficient amount of the first member 10 is formed at the bottom portion 30B of the hole 30H. Thereby, it is easy to uniformly grow the continuous crystal member 20.

In the embodiment, it is favorable for the length 10z of the first member 10 along the first direction (the Z-axis direction) to be, for example, not less than 40% of the depth D1 of the hole 30H along the first direction. By forming a sufficient amount of the first member 10 at the bottom portion 30B of the hole 30H, it is easy to uniformly grow a continuous crystal member 20.

In the embodiment as shown in FIG. 3B, the opening 30P of the hole 30H may be narrower than the maximum width of the hole 30H. For example, the length W2 of the opening 30P along the second direction (in the example, the X-axis direction) may be shorter than a maximum value Wmax of the length along the second direction of the hole 30H. Because the hole 30H has such a configuration, the adhesion of the first element included in the first member 10 to the side portion 30S of the hole 30H is suppressed easily.

In one experimental example according to the embodiment (FIG. 3A), the depth D1 of the hole 30H is about 2579 nm. The length W2 (the width) of the opening 30P is about 866 nm. The maximum value Wmax (the maximum width) of the length along the second direction of the hole 30H is, for example, 1183 nm. The height of the first member 10 (the length 10z along the first direction) is 1087 nm. The width of the first member 10 (the length 10x along the second direction) is 658 nm.

According to investigations by the inventor, in the case where the length W2 (the width) of the opening 30P is about 1000 nm, the uniform crystal member 20 is obtained easily when the length 10z (the height) of the first member 10 is about 200 nm or more. In one example, the length 10z is about 284 nm.

In the embodiment, for example, the crystal member 20 is conductive. The conductivity type of the crystal member 20 may be different from the conductivity type of the second region 32 of the structure body 30. For example, the second region 32 is of an n-type; and the crystal member 20 is of a p-type. For example, the second region 32 may be of the p-type; and the crystal member 20 may be of the n-type. For example, the conductivity type of the second region 32 of the structure body 30 may be the same as or different from the conductivity type of the first region 31 of the structure body 30.

Another example of the crystal growth method according to the embodiment will now be described.

FIG. 4A to FIG. 4H are schematic cross-sectional views illustrating the crystal growth method according to the first embodiment.

Figure 4A:
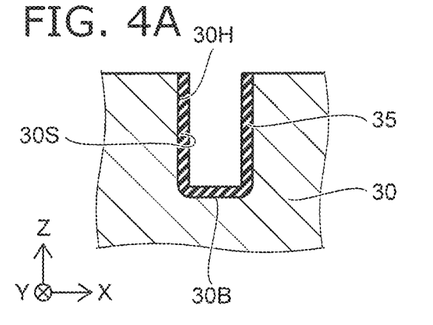
FIG. 4A to FIG. 4H are schematic cross-sectional views illustrating the crystal growth method according to the first embodiment.
Figure 4B:
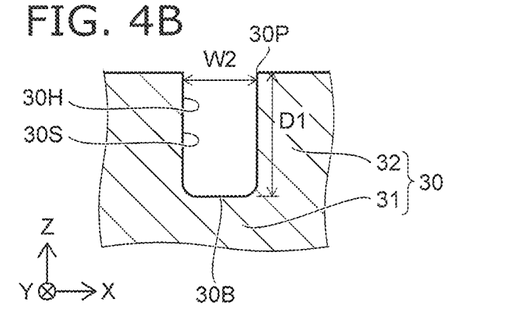
Figure 4C:
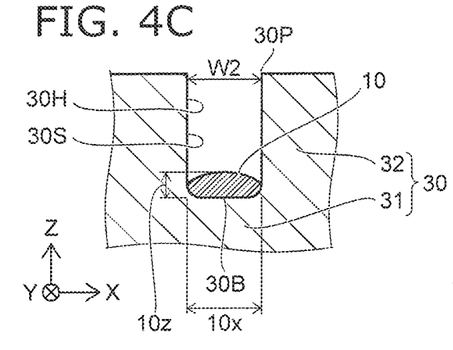

The structure body 30 is prepared as shown in FIG. 4A. The first film 35 is provided in the example as well. At least a portion of the first film 35 is removed (step S105). The structure body 30 is obtained by the removal of the first film 35 (referring to FIG. 4B). The structure body 30 has the hole 30H. The hole 30H includes the bottom portion 30B, the side portion 30S, and the opening 30P. As shown in FIG. 4C, the first member 10 is formed at the bottom portion 30B of the hole 30H. In the example as well, the first element is not adhered to the side portion 30S in the formation of the first member 10. For example, the first member 10 is not adhered to the side portion 30S. For example, the first member 10 is formed by vapor deposition of the first element. For example, the first member 10 is in a solid phase in the first member formation process (in FIG. 4C).

Figure 4D:
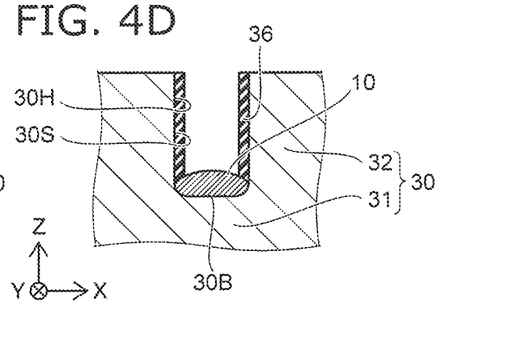

As shown in FIG. 4D, an insulating film 36 is formed at the side portion 30S of the hole 30H (an insulating film formation process; step S115). The insulating film formation process is performed after the first member formation process (FIG. 4C) and before the growth process (FIG. 4E).

In one example, the insulating film 36 may be formed from the structure body 30. In the case where the structure body 30 includes silicon, the insulating film 36 is formed by oxidizing or nitriding the surface portion of the side portion 30S of the hole 30H of the structure body 30. In such a case, the insulating film 36 includes silicon oxide or silicon nitride. The insulating film 36 may be formed by a method such as CVD (Chemical Vapor Deposition), etc., on the side portion 30S of the hole 30H. The insulating film 36 may include, for example, at least one selected from the group consisting of silicon oxide, silicon nitride, silicon oxynitride, and aluminum oxide.

Figure 4E:
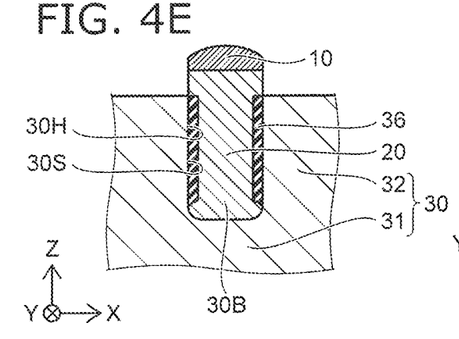

As shown in FIG. 4E, after the insulating film formation process, the crystal member 20 that includes the second element is grown inside the hole 30H by supplying a source material including the second element to the hole 30H.

In the example as well, the first member 10 is provided at the bottom portion 30B but is substantially not provided at the side portion 30S. The crystal member 20 that grows using the first member 10 as a catalyst grows from the bottom portion 30B. The growth of the crystal member 20 from the side portion 30S is suppressed. The crystal member 20 becomes uniform easily. A crystal growth method that can grow a high-quality crystal can be provided.

Figure 4F:
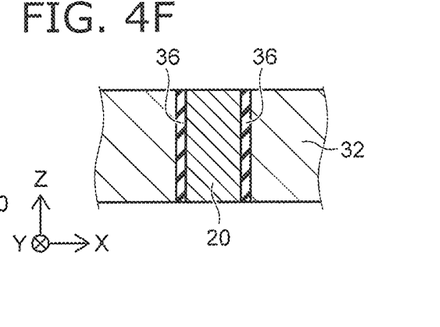

As shown in FIG. 4F, the first member 10 and a portion of the structure body 30 may be removed after forming the crystal member 20 recited above. The portion of the structure body 30 that is removed includes, for example, the first region 31. The crystal member 20 and the second region 32 of the structure body 30 may be electrically insulated by the insulating film 36 by the removal of the portion of the structure body 30. For example, the crystal member 20 may function as a connection member. As shown in FIG. 4F, the surface of the second region 32 of the structure body 30 and the surface of the crystal member 20 are exposed.

Figure 4G:
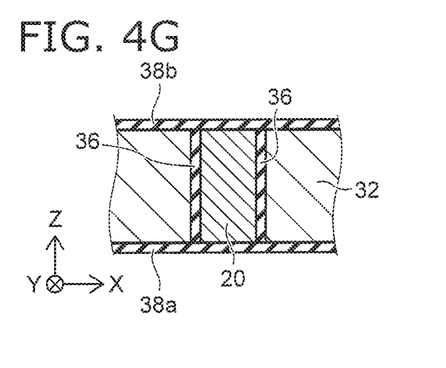

As shown in FIG. 4G, an insulating layer 38a is formed at the surface (e.g., the lower surface) of the second region 32 and the surface (e.g., the lower surface) of the crystal member 20. An insulating layer 38b is formed at another surface (e.g., the upper surface) of the second region 32 and another surface (e.g., the upper surface) of the crystal member 20. The insulating layers 38a and 38b include, for example, an oxide film of silicon oxide or the like, a resin film such as polyimide, etc.

Figure 4H:
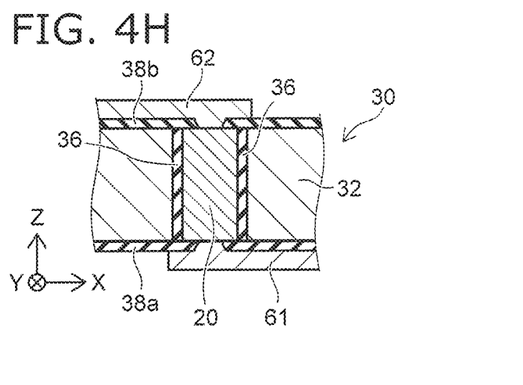

As shown in FIG. 4H, surfaces of the crystal member 20 are exposed by removing a portion of the insulating layer 38a and a portion of the insulating layer 38b. Subsequently, for example, a conductive film 61 and a conductive film 62 are formed. For example, the conductive film 61 is used as an interconnect (or an electrode) on the lower surface side. For example, the conductive film 62 is used as an interconnect (or an electrode) on the upper surface side. The crystal member 20 is between the conductive film 61 and the conductive film 62. A portion of the insulating layer 38a is between the conductive film 61 and the crystal member 20. A portion of the insulating layer 38b is between the conductive film 62 and the crystal member 20. The crystal member 20 is a connection member piercing the structure body 30 (the second region 32). The connection member electrically connects the conductive film 61 and the conductive film 62.

In the embodiment, the second region 32 of the structure body 30 may include a conductive member and an insulating member that are stacked. A crystal growth method example will now be described in which the second region 32 includes a conductive member and an insulating member.

FIG. 5A to FIG. 5E are schematic cross-sectional views illustrating the crystal growth method according to the first embodiment.

Figure 5A:
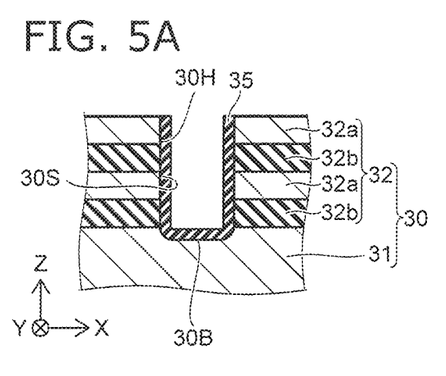
FIG. 5A to FIG. 5E are schematic cross-sectional views illustrating the crystal growth method according to the first embodiment.
Figure 5B:
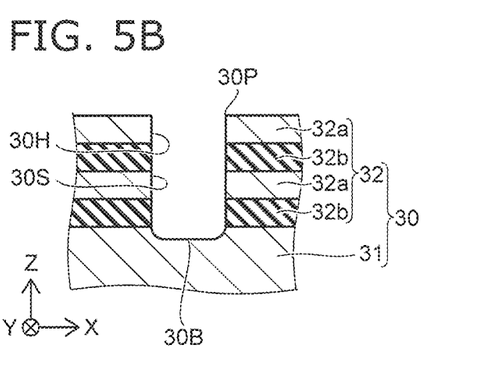

As shown in FIG. 5A, the structure body 30 includes the first region 31 and the second region 32. The second region 32 includes a conductive member 32a and an insulating member 32b. The direction from the insulating member 32b toward the conductive member 32a is aligned with the first direction (the Z-axis direction). The multiple conductive members 32a and the multiple insulating members 32b are provided in the example. One of the multiple insulating members 32b is between one of the multiple conductive members 32a and another one of the multiple conductive members 32a. One of the multiple conductive members 32a may be between one of the multiple insulating members 32b and another one of the multiple insulating members 32b.

Figure 5C:
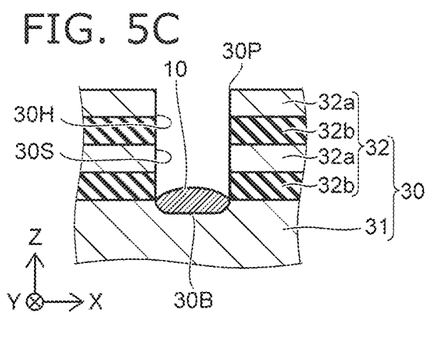

As shown in FIG. 5A, the hole 30H is provided in the structure body 30 including such a second region 32. The hole 30H reaches the first region 31. The first film 35 is provided in the example. At least a portion of the first film 35 is removed (step S105). The structure body 30 is obtained by the removal of the first film 35 (referring to FIG. 5B). As shown in FIG. 5C, the first member 10 is formed at the bottom portion 30B of the hole 30H. In the example as well, the first element is not adhered to the side portion 30S in the formation of the first member 10. For example, the first member 10 is not adhered to the side portion 30S. For example, the first member 10 is formed by vapor deposition of the first element. For example, the first member 10 is in a solid phase in the first member formation process (in FIG. 5C).

Figure 5D:
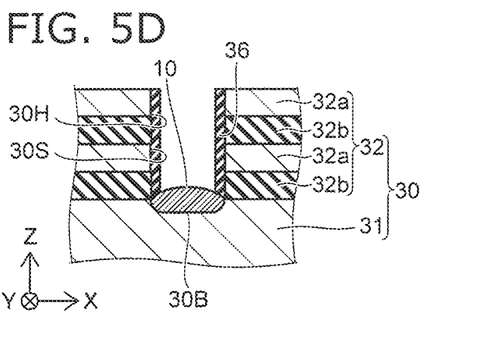
Figure 5E:
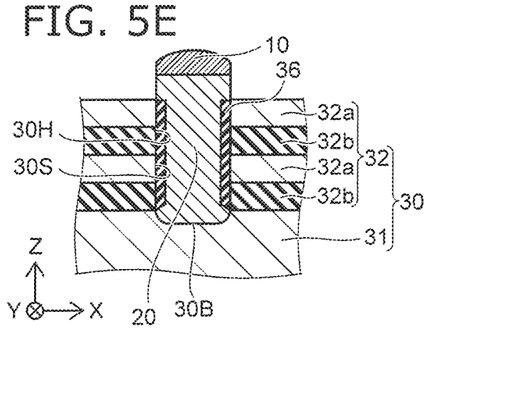

As shown in FIG. 5D, the insulating film 36 is formed at the side portion 30S of the hole 30H (the insulating film formation process; step S115). As shown in FIG. 5E, after the insulating film formation process, the crystal member 20 that includes the second element is grown inside the hole 30H by supplying a source material including the second element to the hole 30H. In the example as well, the first member 10 is provided at the bottom portion 30B but is substantially not provided at the side portion 30S. The crystal member 20 that grows using the first member 10 as a catalyst grows from the bottom portion 30B. The growth of the crystal member 20 from the side portion 30S is suppressed. The crystal member 20 becomes uniform easily. A crystal growth method that can grow a high-quality crystal can be provided. The processes described in reference to FIG. 4F to FIG. 4H may be performed after the process illustrated in FIG. 5E.

In the embodiment recited above, the structure body 30 includes a third element. The first film 35 includes, for example, a compound including the third element. For example, the third element is silicon. In such a case, the first film 35 includes, for example, silicon oxide. In the embodiment, the structure body 30 includes, for example, at least one selected from the group consisting of Si, Ge, SiGe, GaAs, GaN, and InP. The structure body 30 includes, for example, a semiconductor.

As described above, the second element included in the crystal member 20 includes, for example, at least one selected from the group consisting of Si, Ge, Ga, and In. The crystal member 20 includes, for example, at least one selected from the group consisting of Si, Ge, SiGe, GaAs, GaN, and InP. The material of the crystal member 20 may be substantially the same as the material of the structure body 30.

The lattice of the crystal of the crystal member 20 substantially matches the lattice of the crystal of the first region 31 of the structure body 30. The lattice of the crystal of the crystal member 20 substantially matches the lattice of the crystal of the bottom portion 30B of the hole 30H of the structure body 30.

The first element that is included in the first member 10 is determined to match the crystal growth of the crystal member 20.

As described above, the conductivity type of the crystal member 20 may be the n-type or the p-type. The source material that is used in the growth of the crystal member 20 includes, for example, a compound including the second element. The compound is, for example, a precursor. In the case where the crystal member 20 is silicon, the compound may include, for example, at least one selected from the group consisting of monosilane, disilane, and dichlorosilane. The supplying of the source material may include the irradiation of a beam of the second element. In the case where the crystal member 20 is silicon, the supplying of the source material may include the irradiation of an atomic beam of silicon.

The first gas that is used in the growth of the crystal member 20 may include, for example, a source material of an impurity providing a conductivity type. The source material of the impurity includes, for example, a fourth element. The fourth element includes, for example, at least one selected from the group consisting of P, B, As, and Mg. In the case where the crystal member 20 is silicon, the fourth element includes, for example, at least one selected from the group consisting of P and As. Or, in the case where the crystal member 20 is silicon, the fourth element includes at least one selected from the group consisting of B and Al. In the case where the crystal member 20 includes GaN, the fourth element includes one of Mg or Si.

The first gas may include at least one selected from the group consisting of hydrogen, nitrogen, argon, and helium. These elements are, for example, elements of the carrier gas.

In the embodiment, the depth D1 of the hole 30H is, for example, not less than 1 μm and not more than 1000 μm. The depth D1 may be 50 μm or less. The length W2 along the second direction of the opening 30P of the hole 30H is, for example, not less than 10 nm and not more than 2000 nm. The length W3 along the third direction of the opening 30P of the hole 30H is, for example, not less than 0.1 μm and not more than 5 μm.

Second Embodiment

A second embodiment relates to a semiconductor device.

Figure 6:
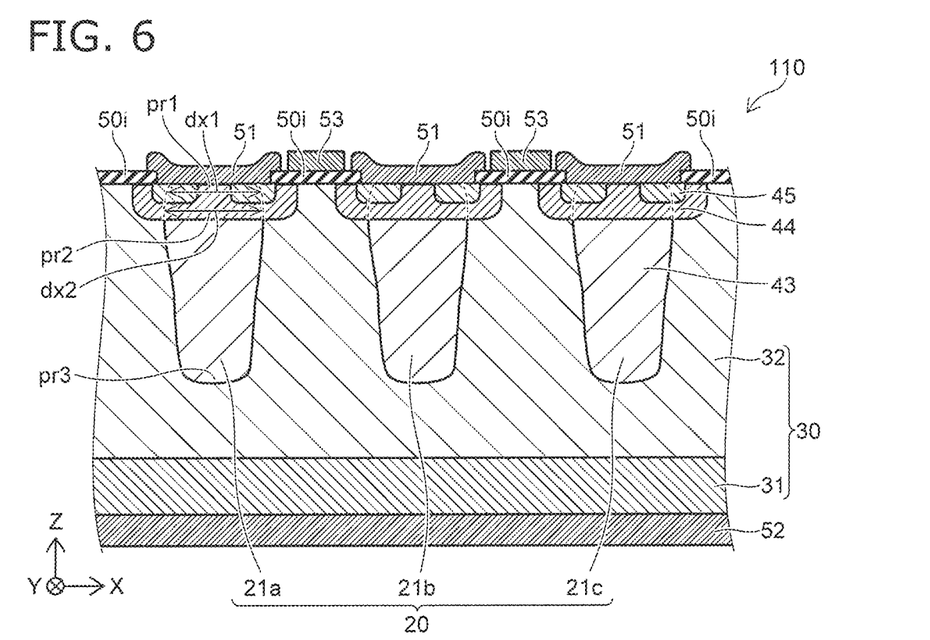
FIG. 6 is a schematic cross-sectional view illustrating the semiconductor device according to the second embodiment.

FIG. 6 is a schematic cross-sectional view illustrating the semiconductor device according to the second embodiment.

As shown in FIG. 6, the semiconductor device 110 according to the embodiment includes the structure body 30 and the crystal member 20. The structure body 30 includes a semiconductor. The structure body 30 includes the first region 31 and the second region 32.

Multiple crystal members 20 are provided in the example. The multiple crystal members 20 include, for example, crystal members 21a to 21c, etc. One of the multiple crystal members 20 (e.g., the crystal member 21a) will now be focused upon.

The direction from the first region 31 toward the crystal member 21a is taken as the first direction. The first direction is, for example, the Z-axis direction. The direction from the crystal member 21a toward the second region 32 is taken as the second direction. The first direction crosses the second direction. The second direction is, for example, the X-axis direction. The crystal orientation of the crystal member 21a is aligned with the crystal orientation of the first region 31. The crystal orientation of the crystal member 21a is aligned with the crystal orientation of the second region 32.

The crystal member 21a includes a first partial region pr1, a second partial region pr2, and a third partial region pr3. The third partial region pr3 contacts the first region 31. In the first direction (the Z-axis direction), the second partial region pr2 is between the third partial region pr3 and the first partial region pr1. The length along the second direction of the first partial region pr1 is taken as a length dx1. The length along the second direction of the second partial region pr2 is taken as a length dx2. The length dx1 is shorter than the length dx2.

The crystal member 20 (e.g., the crystal member 21a) can be formed by performing crystal growth by supplying the second element to the hole 30H provided in the structure body 30 (referring to FIG. 2B, etc.). The third partial region pr3 is, for example, a portion contacting the bottom portion 30B of the hole 30H. The first partial region pr1 is, for example, a portion corresponding to the opening of the hole 30H. For example, the second partial region pr2 corresponds to the portion where the width of the hole 30H is a maximum.

Because the width (the length dx1) of the first partial region pr1 corresponding to the opening is narrower than the width (the length dx2) of the second partial region pr2 corresponding to the portion where the width is a maximum, the first member 10 does not easily adhere to the side portion 30S of the hole 30H. Therefore, high quality of the crystal member 20 is obtained.

As shown in FIG. 6, the semiconductor device 110 includes first to third electrodes 51 to 53. The structure body 30 includes third to fifth regions 43 to 45.

For example, the direction from a second electrode 52 toward the first electrode 51 is aligned with the Z-axis direction. The direction from the second electrode 52 toward the third electrode 53 is aligned with the Z-axis direction. The third region 43 includes the third partial region pr3 of the crystal member 20. The fourth region 44 is between the third region 43 and the first electrode 51. The fifth region 45 is between the fourth region 44 and the first electrode 51. The first region 31, the second region 32, the third region 43, the fourth region 44, and the fifth region 45 include, for example, silicon.

The first region 31 is, for example, an $n^+$-region. The second region 32 is, for example, an $n^-$-region. The third region 43 is, for example, a $p^-$-region. The fourth region 44 is, for example, an $n^+$-region. The fifth region 45 is, for example, an $n^+$-region. For example, at least a portion of the third region 43, at least a portion of the fourth region 44, and at least a portion of the fifth region 45 can be formed from the crystal member 20. For example, the third region 43, the fourth region 44, and the fifth region 45 can be formed by implanting an impurity of the appropriate conductivity type into the crystal member 20 or the second region 32.

The second region 32 is between the second electrode 52 and the third electrode 53. An insulating layer 50i is between the second region 32 and the third electrode 53. The semiconductor device 110 is, for example, a transistor having a super junction structure.

In the semiconductor device 110 according to the embodiment, for example, good characteristics are obtained stably because the crystal quality of the crystal member 20 is high.

Figure 7:
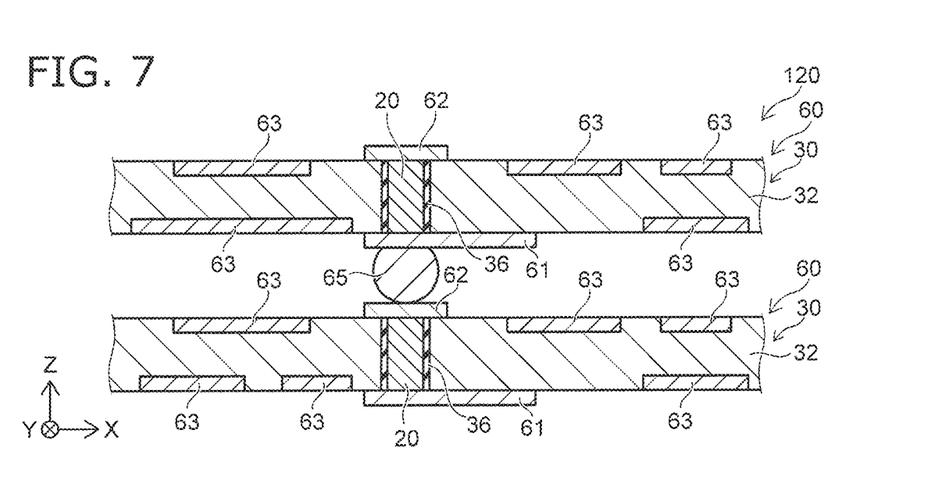
FIG. 7 is a schematic cross-sectional view illustrating a semiconductor device according to the second embodiment.

FIG. 7 is a schematic cross-sectional view illustrating a semiconductor device according to the second embodiment.

As shown in FIG. 7, the semiconductor device 120 according to the embodiment includes the structure body 30 and the crystal member 20. The structure body 30 and the crystal member 20 are included in one semiconductor component 60. The crystal member 20 pierces the second region 32 of the structure body 30. The insulating film 36 is between the second region 32 and the crystal member 20. In the example, the semiconductor component 60 includes the conductive film 61 and the conductive film 62. The conductive film 61 and the conductive film 62 are electrically connected by the crystal member 20. The insulating layers 38a and 38b described in reference to FIG. 4G and FIG. 4H are not illustrated in FIG. 7.

In the example, the semiconductor component 60 includes a circuit portion 63. The circuit portion 63 may include, for example, a transistor or the like based on the semiconductor of the second region 32.

Multiple semiconductor components 60 are provided in the example. For example, the multiple semiconductor components 60 are stacked in the Z-axis direction. A connection member 65 is provided between one semiconductor component 60 and another one semiconductor component 60. The connection member 65 electrically connects the conductive film 62 of the one semiconductor component 60 and the conductive film 61 of the other one semiconductor component 60. In the semiconductor device 120, the conductive film 61 and the conductive film 62 are electrically connected with a low resistance by the crystal member 20. Good characteristics are obtained stably.

For example, in the manufacturing processes of a semiconductor device, a semiconductor member is filled into a hole (a trench, a via hole, etc.) formed in a semiconductor layer. For example, stacked multiple circuit layers are electrically connected by such a semiconductor member. On the other hand, a semiconductor crystal is filled into a trench in a semiconductor device having a super junction structure.

There is an example in which a semiconductor crystal is grown from the bottom portion of the hole and the side portion of the hole when filling the semiconductor crystal into the hole such as the trench, etc. In such a case, the crystal that is grown from the bottom portion and the crystal that is grown from the side portion contact each other. A discontinuous interface or gap occurs between the multiple crystals. This phenomenon is pronounced when the aspect ratio of the hole is high.

Due to the discontinuous interface or gap between the multiple crystals, the characteristics degrade; and the characteristics become nonuniform. For example, the characteristics of the semiconductor device easily become unstable. For example, the breakdown voltage of the semiconductor device may decrease due to the discontinuous interface or gap.

In the embodiment, for example, the first film 35 of the hole 30H is removed. Further, the first member 10 that includes the first element is formed at the bottom portion 30B of the hole 30H so that the first element is not adhered to the side portion 30S of the hole 30H. Thereby, the crystal member 20 grows from the bottom portion 30B of the hole 30H. A uniform and high-quality crystal member 20 is obtained. The crystal orientation of the crystal member 20 is aligned with the crystal orientation of the structure body 30 in which the hole 30H is provided.

According to the embodiments, a crystal growth method and a semiconductor device can be provided in which a high-quality crystal can be grown.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components used in crystal growth methods such as structure bodies, first members, crystal members, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all crystal growth methods and semiconductor devices practicable by an appropriate design modification by one skilled in the art based on the crystal growth methods and the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A crystal growth method, comprising:
    removing at least a portion of a first film, the first film being provided at a bottom portion and at a side portion of a hole in a structure body before the removing;
    forming a first member at at least a part of the bottom portion of the hole in the structure body, the first member including a first element; and
    growing a crystal member inside the hole by supplying a source material to the hole after the forming the first member, the source material including a second element, the crystal member including the second element.

2. The method according to claim 1, wherein
    the first member contacts the bottom portion before the growing the crystal member, and
    the crystal member contacts the bottom portion after the growing the crystal member.

3. The method according to claim 1, wherein the crystal member contacts at least a portion of the side portion.

4. The method according to claim 1, wherein
    the first member is in a solid phase in the forming the first member, and
    the first member is in a liquid phase in the growing the crystal member.

5. The method according to claim 1, wherein
    the structure body includes a third element, and
    the first film includes a compound including the third element.

6. The method according to claim 1, wherein
    the hole further has an opening, and
    a length of the first member along a first direction is not less than 20% of a length of the opening along a second direction crossing the first direction, the first direction being from the bottom portion toward the opening.

7. The method according to claim 1, wherein
    the hole further has an opening, and
    a length of the first member along a first direction is longer than a length of the first member along a second direction crossing the first direction, the first direction being from the bottom portion toward the opening.

8. The method according to claim 1, wherein
    the hole further has an opening, and
    a length of the opening along a second direction crossing a first direction is shorter than a maximum value of a length along the second direction of the hole, the first direction being from the bottom portion toward the opening.

9. The method according to claim 1, wherein
    the hole further has an opening, and
    a length of the first member along a first direction is not less than 40% of a depth of the hole along the first direction, the first direction being from the bottom portion toward the opening.

10. The method according to claim 1, wherein
    the hole further has an opening,
    a direction from the bottom portion toward the opening is aligned with a first direction,
    a depth along the first direction of the hole is a sum of a bottom portion length along the first direction of the bottom portion and a side portion length along the first direction of the side portion, and
    the bottom portion length is 50% of the depth.

11. The method according to claim 1, wherein
    the structure body includes:
        a first region including the bottom portion; and
        a second region including the side portion,
    a crystal orientation of the crystal member is aligned with a crystal orientation of the first region, and
    the crystal orientation of the crystal member is aligned with a crystal orientation of the second region.

12. The method according to claim 1, further comprising forming an insulating film at the side portion after the forming the first member and before the growing the crystal member.

13. The method according to claim 1, wherein the first element includes at least one selected from the group consisting of Au, Al, Ag, Bi, Cd, Co, Cu, Dy, Fe, Ga, Gd, In, Mg, Mn, Ni, Os, Pb, Pd, Pt, Te, Ti, and Zn.

14. The method according to claim 1, wherein the second element includes at least one selected from the group consisting of Si, Ge, Ga, and In.

15. The method according to claim 1, wherein the crystal member includes at least one selected from the group consisting of Si, Ge, SiGe, GaAs, GaN, and InP.

16. The method according to claim 1, wherein the source material includes a fourth element including at least one selected from the group consisting of P, B, As, and Mg.

17. The method according to claim 1, wherein
the supplying the source material includes supplying a first gas, and
the first gas includes at least one selected from the group consisting of hydrogen, nitrogen, argon, and helium.

18. The method according to claim 1, wherein the forming the first member includes performing at least one of vapor deposition of the first element or long throw sputtering of the first element.

19. The method according to claim 1, wherein the first element does not adhere to at least a part of the side portion in the forming the first member.

\* \* \* \* \*